United States Patent
Qian

(10) Patent No.: US 8,294,697 B2
(45) Date of Patent: Oct. 23, 2012

(54) REGISTER CIRCUIT AND DISPLAY DRIVING CIRCUIT HAVING THE SAME

(75) Inventor: Dong Qian, Plum Village Township (CN)

(73) Assignee: Chimei Innolux Corporation (TW)

( * ) Notice: Subject to any disclaimer, the term of this patent is extended or adjusted under 35 U.S.C. 154(b) by 528 days.

(21) Appl. No.: 12/616,485

(22) Filed: Nov. 11, 2009

(65) Prior Publication Data

US 2010/0128008 A1 May 27, 2010

(30) Foreign Application Priority Data

Nov. 21, 2008 (TW) .............................. 97145081 A

(51) Int. Cl.
*G06F 3/038* (2006.01)
(52) U.S. Cl. ......... 345/205; 345/100; 345/558; 345/571
(58) Field of Classification Search .................. None
See application file for complete search history.

(56) References Cited

U.S. PATENT DOCUMENTS

| 6,819,624 | B2 * | 11/2004 | Acharya et al. | 365/233.14 |
| 7,420,606 | B2 * | 9/2008 | Takeda et al. | 348/312 |
| 2008/0253205 | A1 * | 10/2008 | Park | 365/189.16 |

* cited by examiner

*Primary Examiner* — Muhammad N Edun
(74) *Attorney, Agent, or Firm* — Lowe Hauptman Ham & Berner, LLP

(57) ABSTRACT

Provided is a register circuit including a timing circuit controlled by an external control signal to receive an external timing signal and then to transmit a first timing signal and a second timing signal, wherein the first timing signal and the second timing signal have phases inverse to each other; two pass gates controlled by the first timing signal and the second timing signal to receive starting pulse signals and then transmit the pulse signals as one of the pass gates turns on; a signal output unit receiving the pulse signals to transmit an output signal; and two switches controlled by the external control signal to receive and to transmit the output signal as one of the switches turns on.

20 Claims, 4 Drawing Sheets

REGISTER CIRCUIT AND DISPLAY DRIVING CIRCUIT HAVING THE SAME

CROSS-REFERENCE TO RELATED APPLICATIONS

This application claims the right of priority based on Taiwan Patent Application No. 97145081 entitled "REGISTER CIRCUIT AND DISPLAY DRIVING CIRCUIT HAVING THE SAME," filed on Nov. 21, 2008, which is incorporated herein by reference and assigned to the assignee herein.

FIELD OF INVENTION

The present invention relates to a register circuit, and more particularly to a register circuit having a smaller chip area for use in a driving circuit of a display.

BACKGROUND OF THE INVENTION

A shift register for the driving circuit of a display typically includes a plurality of register circuits. As known, the shift register in the gate driving circuit of the display outputs scanning signals line by line with the scan lines, and the shift register in the source driving circuit of the displays writes image signals to the signal lines to drive the pixels to display images.

FIG. 1 shows a conventional driving circuit of a display, where the driving circuit includes the same register circuits 91 and 92, the dynamic selecting circuits 93 and 94, and the vertical scan directional control circuit 95. As shown, the register circuits 91 and 92 work together with the dynamic selecting circuits 93 and 94 and the vertical scan directional control circuit 95 for the desired operation briefly explained as follows.

At first, a starting pulse signal STV is inputted to the register circuit 91, and then in response to two vertical scan directional control signals CSV and XCSV, which have phases inverse to each other, the register circuit 91 outputs an output signal $Q_{91}$. Then via the vertical scan directional control circuit 95, the output signal $Q_{91}$ turns on the gates of the pixel array and becomes the staring pulse signal STV2 for the next register circuit 92, which will output an output signal $Q_{92}$ and can carry on the scanning process with other subsequent register circuits.

However, the inclusion of the register circuits 91 and 92, the dynamic selecting circuits 93 and 94, and the vertical scan directional control circuit 95 would occupy a relatively large chip area and increase the production cost. Therefore it is desired to have a register circuit with a smaller chip area.

SUMMARY OF THE INVENTION

One aspect of the present invention is to provide a register circuit for a driving circuit of a display with a small chip area.

In one embodiment, disclosed is a register circuit including a timing circuit controlled by an external control signal to receive an external timing signal and then to transmit a first timing signal and a second timing signal, wherein the first timing signal and the second timing signal have phases inverse to each other; two pass gates controlled by the first timing signal and the second timing signal to receive starting pulse signals and then transmit the pulse signals as one of the pass gates turns on; a signal output unit receiving the pulse signals to transmit an output signal; and two switches controlled by the external control signal to receive and to transmit the output signal as one of the switches turns on.

In another embodiment, disclosed is a display including a display panel and a driving circuit. The driving circuit has a plurality of register circuits, and each register circuit includes a timing circuit controlled by an external control signal to receive an external timing signal and then to transmit a first timing signal and a second timing signal, wherein the first timing signal and the second timing signal have phases inverse to each other; two pass gates controlled by the first timing signal and the second timing signal to receive starting pulse signals and then transmit the pulse signals as one of the pass gates turns on; a signal output unit receiving the pulse signals to transmit an output signal; and two switches controlled by the external control signal to receive and to transmit the output signal as one of the switches turns on.

BRIEF DESCRIPTION OF THE DRAWINGS

The invention will now be further described by way of example only with reference to the accompany drawings in which.

DETAILED DESCRIPTION OF THE PREFERRED EMBODIMENTS

The foregoing and other features of the invention will be apparent from the following more particular description and drawings of embodiment of the invention, wherein similar reference numbers typically represent similar components. Although only a few embodiments of the present invention have been described, it should be understood that the present invention may be embodied in many other specific forms without departing from the spirit of the scope of the present invention.

Figure 1:
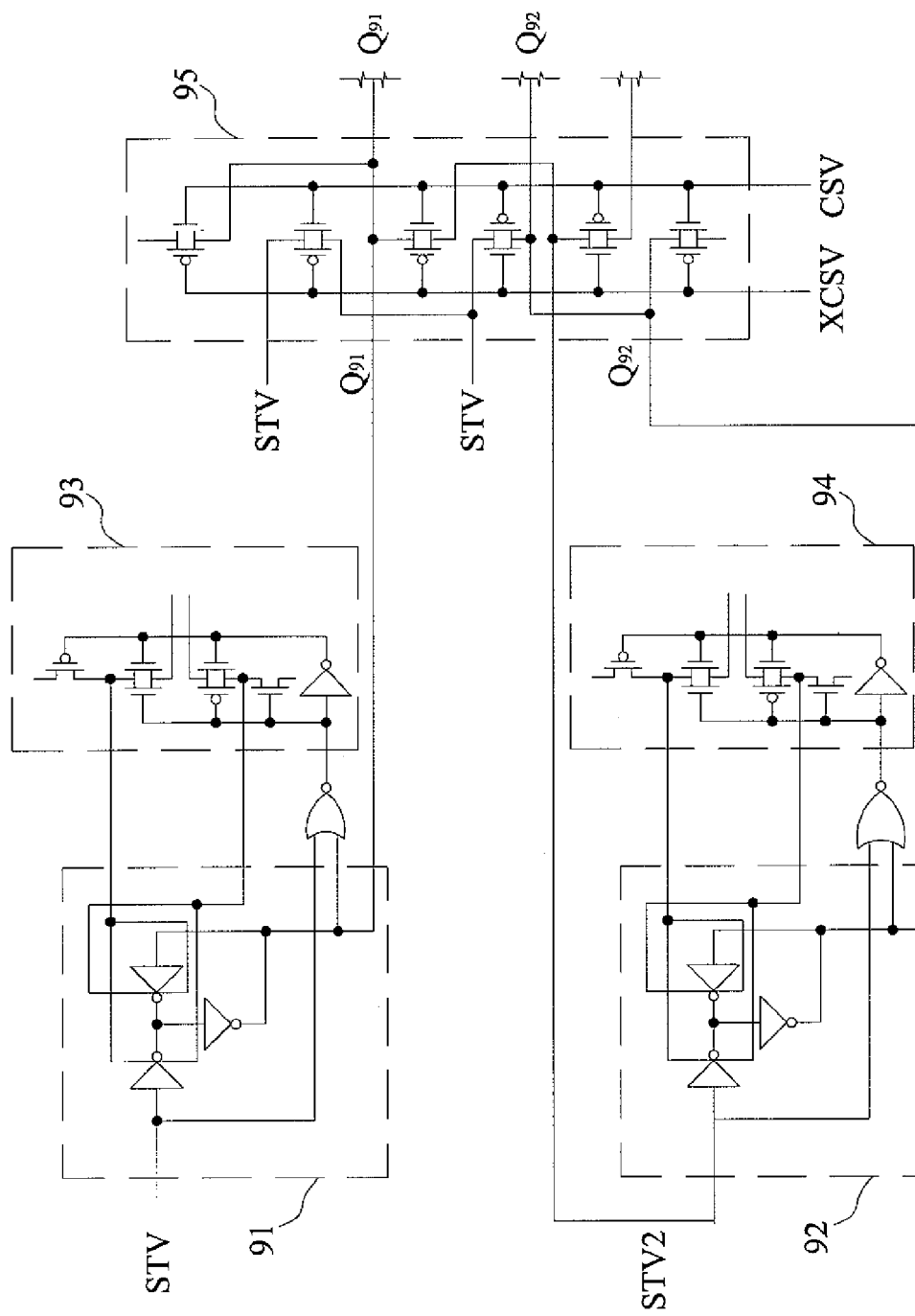
FIG. 1 is a diagram showing a conventioanl driving circuit of a display.
Figure 2A:
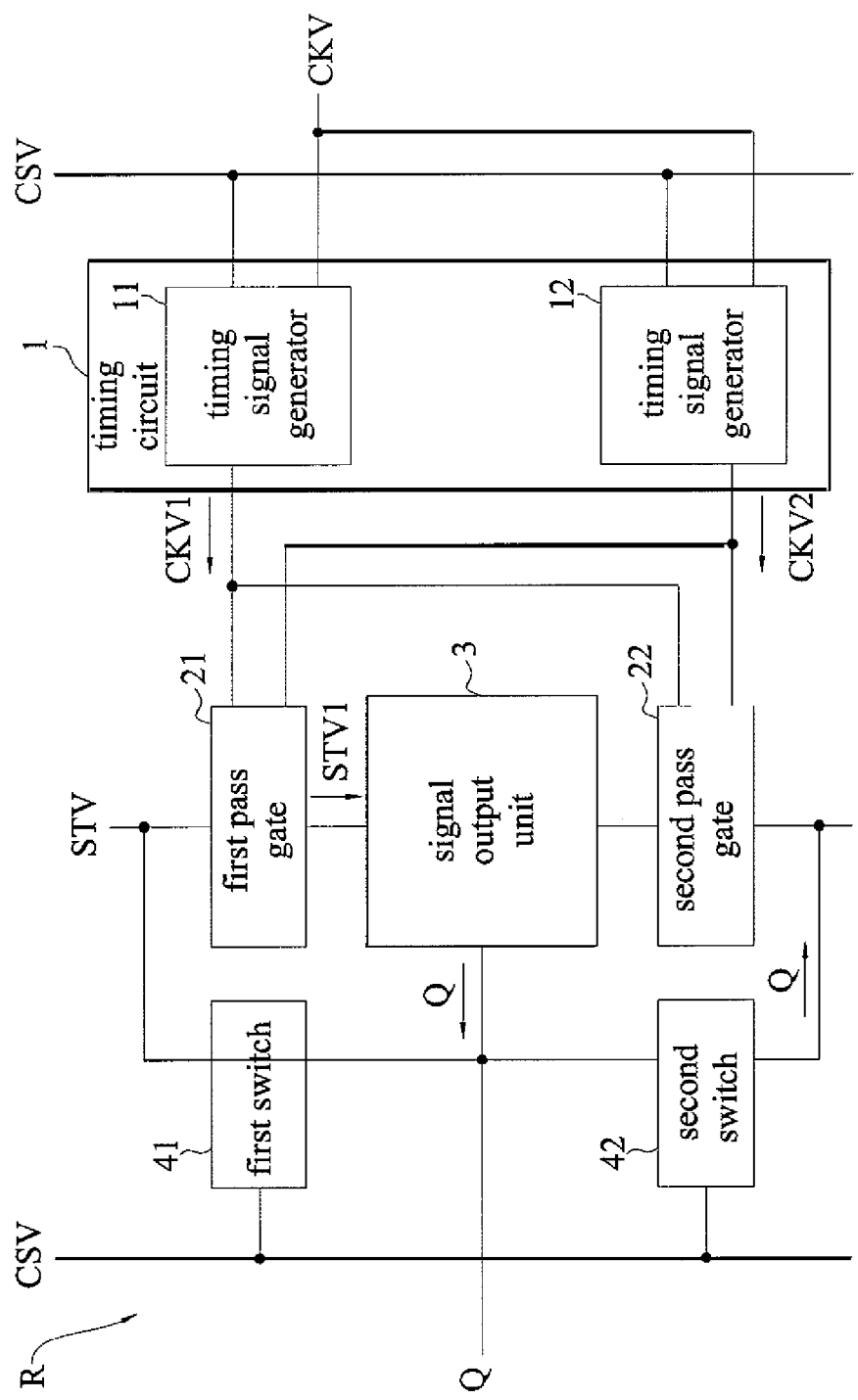
FIG. 2A is a functional block of a register circuit according to an embodiment of the present invention.

FIG. 2A shows a diagram of the register circuit according to an embodiment of the present invention.

As shown in FIG. 2A, the register circuit R includes a timing circuit 1, two pass gates 21 and 22, a signal output unit 3, and two switches 41 and 42. In this embodiment, the register circuit R would receive an external control signal CSV, a staring pulse signal STV, and an external timing signal CKV. Preferably, the external control signal CSV is a vertical scan direction control signal provided by a driving IC (not shown), but the invention is not limited to this embodiment.

In response to the external control signal CSV, the timing circuit 1 receives the external timing signal CKV and accordingly generates a first timing signal CKV1 and a second timing signal CKV2, where the first timing signal CKV1 and the second timing signal CKV2 have phases inverse to each other. Particularly, the external timing signal CKV, the first timing signal CKV1, and the second timing signal CKV2 all have the same periods. Also in this embodiment, the timing circuit 1 includes two timing signal generators 11 and 12 respectively for generating the first timing signal CKV1 and the second timing signal CKV2.

Two pass gates 21 and 22 are isolated to each other. How to achieve the isolation between two pass gates 21 and 22 will be discussed later. In response to the first timing signal CKV1 and the second timing signal CKV2, the first pass gate 21 turns on to receive the starting pulse signal STV and outputs a pulse signal STV1 and the second pass gate 22 turns off. In an alternative embodiment, the second pass gate 22 turns on to receive the starting pulse signal STV and outputs a pulse signal and the first pass gate 22 turns off. That is, when one of the first pass gate 21 and the second pass gate 22 turns on, the other one should turn off.

Also as shown in FIG. 2A, the signal output unit 3 is provided for receiving the pulse signal STV1 from the first pass gate 21 and accordingly outputting an output signal Q.

Two switches 41 and 42 are controlled by the external control signal CSV. When the first pass gate 21 turns on, in response to the external control signal CSV, the switch 42 turns on to pass the output signal Q from the signal output unit 3, and the switch 41 turns off. Alternatively, the switch 41 turns on to pass the output signal Q from the signal output unit 3, and the switch 42 turns off. That is, when one of switches 41 and 42 turns on, the other one should turn off.

Figure 2B:
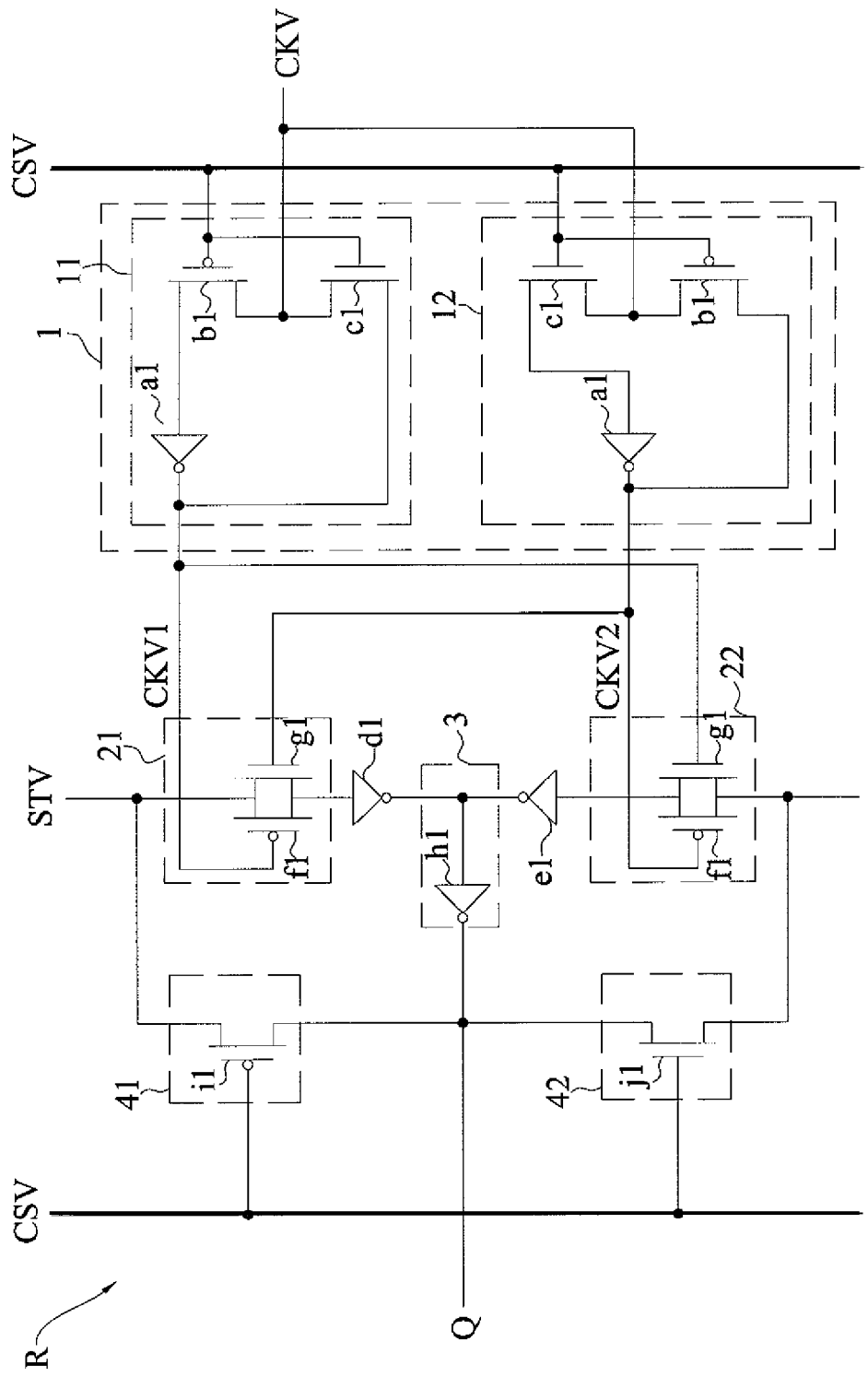
FIG. 2B shows more details of a register circuit according to an embodiment of the present invention.

FIG. 2B further shows the register circuit according to an embodiment of the present invention.

Referring to both FIGS. 2A and 2B, the timing signal generators 11 and 12 of the timing circuit 1 respectively include an inverter a1, a PMOS transistor b1, and an NMOS transistor c1, but note that the present invention is not limited to this embodiment. Further the isolation between the first pass gate 21 and the second pass gate 22 is achieved by two inverters d1 and e1 disposed in opposite direction, as shown in FIG. 2B. The first pass gate 21 and the second pass gate 22 both include a PMOS transistor f1 and an NMOS g1, but note that the present invention is not limited to this embodiment. The signal output unit 3 could include an inverter h1. The two switches 41 and 42 could be embodied as a PMOS transistor i1 and an NMOS transistor j1, but those skilled in the art can replace them with other equivalent electronic components.

Figure 3:
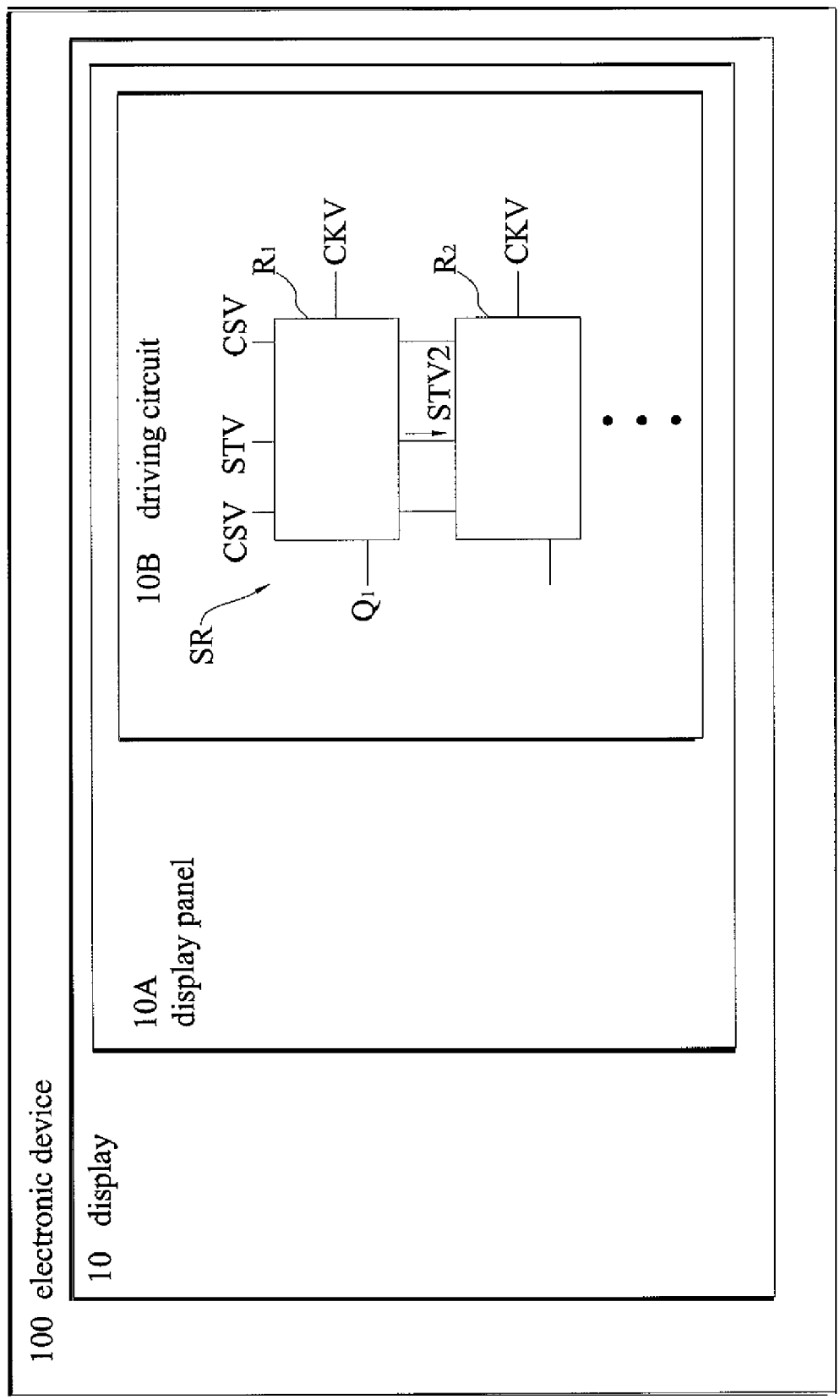
FIG. 3 illustrates an electronic device according to an embodiment of the present invention.

FIG. 3 shows the block diagram of the electronic device 100 according to an embodiment of the present invention. The register circuit R mentioned above can be adopted in a display 10 of the electronic device 100. As shown in FIG. 3, the display 10 has a display panel 10A, and the display panel 10A has a driving circuit 10B. In the driving circuit 10B, the shift register SR includes a plurality of register circuits e.g., $R_1$ and $R_2$. Because register circuits $R_1$ and $R_2$ occupy smaller chip areas, the driving circuit 10B in this embodiment, which saves a dynamic selection circuit and a vertical scan directional control circuit of the conventional driving circuit driving circuit, does not need large chip area.

To clearly explain the invention, FIG. 3 only shows the first register circuit $R_1$ and the second register circuit $R_2$. The first register circuit $R_1$ and the second register circuit $R_2$ could be referred to the register circuit R shown in FIG. 2B, so the details are omitted hereinafter.

In the display 10, the driving circuit 10B operates the panel 10A to display images. Moreover, the display 10 could be embedded in the electronic device 100. In this embodiment, the electronic device 100 could be a TV, a mobile phone, a digital camera, a personal digital assistant (PDA), a notebook computer, a desktop computer, a television, a global positioning system (GPS), a car media player, an avionics display, a digital photo frame, a portable video player, etc.

In an embodiment, when the external control signal is high (e.g., CSV=1), the shift register SR performs a top-down scanning. Alternatively, when the external control signal is low (e.g., CSV=0), the shift register SR performs a bottom-up scanning. As those skilled in the art should understand, these two types of scanning use alternative external control signals, but they do not change the operating principle of the shift register SR and the operation of the pass gates and the switches, so the details for bottom-up scanning are omitted hereinafter.

The top-down scanning of the shift register SR is described as follows. Referring to the embodiment shown in FIG. 2A and FIG. 3, the shift register SR includes several register circuits $R_1$ and $R_2$ which are identical to each other and are arranged top-down. Both the register circuits $R_1$ and $R_2$ would receive the external control signal CSV, the starting pulse signal STV, and the external timing signal CKV, just like the register circuits R shown in FIG. 2A.

Referring back to the register circuits R in FIG. 2A, in response to the external control signal CSV, the timing circuit 1 of the register circuit R outputs the first timing signal CKV1 and the second timing signal CKV2 which have phase inverse to each other. Then, in response to the first timing signal CKV1 and the second timing signal CKV2, the first pass gate 21 turns on to receive the starting pulse signal STV and outputs a pulse signal STV1. After that, the signal output unit 3 receives the pulse signal STV1 and outputs an output signal Q. Meanwhile the switch 42 (or the switch 41 in the bottom-up scanning) is controlled by the external control signal CSV. When the first pass gate 21 turns on, in response to the external control signal CSV, the switch 42 turns on to pass the output signal Q from the signal output unit 3. Accordingly the output signal Q1 becomes the starting pulse signal STV2 of the next register circuit, said, the register circuit $R_2$ in FIG. 3.

Following the operations mentioned here, the second register circuit $R_2$ can also provide a starting pulse signal to a further subsequent register circuit. Therefore the first register circuit $R_1$, the second register circuit $R_2$ and other subsequent register circuits have a top-down scanning. And when the external control signal is changed (e.g., from CSV=1 to CSV=0), the first register circuit $R_1$, the second register circuit $R_2$ and other subsequent register circuits can also have a bottom-up scanning.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. A register circuit, comprising:
   a timing circuit, responsive to an external control signal, receiving an external timing signal and accordingly outputting a first timing signal and a second timing signal, wherein the first timing signal and the second timing signal have phases inverse to each other;
   two pass gates, responsive to the first timing signal and the second timing signal, so that alternately one of the pass gates turns on to receive a starting pulse signal and accordingly output a pulse signal, wherein the two pass gates are isolated;
   a signal output unit, receiving the pulse signal to output an output signal; and
   two switches, responsive to the external control signal, so that alternately one of the switches turns on to receive the output signal from the signal output unit and then further passes the output signal.

2. The register circuit according to claim 1, wherein the timing circuit comprises two timing signal generators respectively for generating the first timing signal and the second timing signal.

3. The register circuit according to claim 2, wherein each timing signal generator comprises an inverter, a PMOS transistor, and an NMOS transistor.

4. The register circuit according to claim 1, wherein the signal output unit comprises an inverter.

5. The register circuit according to claim 1, wherein the two pass gates are isolated by two inverters disposed between the two pass gates.

6. The register circuit according to claim 1, wherein each pass gate comprises a PMOS transistor and an NMOS transistor.

7. The register circuit according to claim 1, wherein the two switches comprise a PMOS transistor and an NMOS transistor.

8. The register circuit according to claim 1, wherein the external control signal is a vertical scan directional control signal.

9. The register circuit according to claim 1, the register circuit being connected to a subsequent register circuit which is identical to the register circuit;
wherein one of the switches of the register circuit passes the output signal as the external control signal for the subsequent register circuit.

10. A display, comprising a panel and a driving circuit, the driving circuit comprising a plurality of register circuits, each register circuit comprising:
a timing circuit, responsive to an external control signal, receiving an external timing signal and accordingly output a first timing signal and a second timing signal, wherein the first timing signal and the second timing signal have phases inverse to each other;
two pass gates, responsive to the first timing signal and the second timing signal, so that alternately one of the pass gates turns on to receive a starting pulse signal and accordingly output a pulse signal, wherein the two pass gates are isolated;
a signal output unit receiving the pulse signal to output an output signal; and
two switches, responsive to the external control signal, so that alternately one of the switches turns on to receive the output signal from the signal output unit and then further passes the output signal.

11. The display according to claim 10, wherein the timing circuit comprises two timing signal generators respectively for generating the first timing signal and the second timing signal.

12. The display according to claim 11, wherein each timing signal generator comprises an inverter, a PMOS transistor, and an NMOS transistor.

13. The display according to claim 10, wherein the signal output unit comprises an inverter.

14. The display according to claim 10, wherein the two pass gates are isolated by two inverters disposed between the two pass gates.

15. The display according to claim 10, wherein each pass gate comprises a PMOS transistor and an NMOS transistor.

16. The display according to claim 10, wherein the two switches comprise a PMOS transistor and an NMOS transistor.

17. The display according to claim 10, wherein the external control signal is a vertical scan directional control signal.

18. The display according to claim 10, wherein the plurality of register circuits comprises a first register circuit and a second register circuit;
wherein one of the switches of the first register circuit passes the output signal as the external control signal for the second register circuit.

19. An electronic device, comprising the display according to claim 10, wherein the electronic device is a TV, a mobile phone, a digital camera, a personal digital assistant (PDA), a notebook computer, a desktop computer, a television, a global positioning system (GPS), a car media player, an avionics display, a digital photo frame, or a portable video player.

20. The electronic device according to claim 19, wherein the plurality of register circuits comprises a first register circuit and a second register circuit;
wherein depending on the external control signal, either one of the switches of the first register circuit passes the output signal as the external control signal for the second register circuit or one of the switches of the second register circuit passes the output signal as the external control signal for the first register circuit.

* * * * *